(12) United States Patent
Koyanagi et al.

(10) Patent No.: US 9,559,612 B2
(45) Date of Patent: Jan. 31, 2017

(54) POWER CONVERSION DEVICE

(71) Applicants: Mitsubishi Electric Corporation, Chiyoda-ku (JP); TOSHIBA MITSUBISHI-ELECTRIC INDUSTRIAL SYSTEMS CORPORATION, Chuo-ku (JP)

(72) Inventors: Kimiyuki Koyanagi, Chiyoda-ku (JP); Masahiro Kinoshita, Chuo-ku (JP)

(73) Assignees: Mitsubishi Electric Corporation, Chiyoda-ku (JP); TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 14/890,511

(22) PCT Filed: Mar. 14, 2014

(86) PCT No.: PCT/JP2014/056986
§ 371 (c)(1),
(2) Date: Nov. 11, 2015

(87) PCT Pub. No.: WO2014/203571
PCT Pub. Date: Dec. 24, 2014

(65) Prior Publication Data
US 2016/0111976 A1    Apr. 21, 2016

(30) Foreign Application Priority Data

Jun. 17, 2013  (JP) .................... 2013-126427

(51) Int. Cl.
*H02M 7/537* (2006.01)
*H02M 7/00* (2006.01)

(52) U.S. Cl.
CPC ............. *H02M 7/537* (2013.01); *H02M 7/003* (2013.01)

(58) Field of Classification Search
CPC .............................. H02M 7/537; H02M 7/003
See application file for complete search history.

(56) References Cited

U.S. PATENT DOCUMENTS

| 4,436,953 A | * | 3/1984 | Gottlieb | H02G 5/005 |
| | | | | 174/72 B |
| 5,422,440 A | * | 6/1995 | Palma | H02M 7/003 |
| | | | | 174/133 B |

(Continued)

FOREIGN PATENT DOCUMENTS

| JP | 08-007829 Y | 3/1996 |
| JP | 2004-153951 A | 5/2004 |

OTHER PUBLICATIONS

International Search Report issued Jun. 3, 2014, for PCT/JP2014/056986, filed Mar. 14, 2014.

*Primary Examiner* — Jue Zhang
(74) *Attorney, Agent, or Firm* — Oblon, McClelland, Maier & Neustadt, L.L.P.

(57) ABSTRACT

Four bus bars, which are two positive-electrode-side bus bars connecting a positive electrode of a capacitor series circuit and a positive electrode of a power conversion section, a negative-electrode-side bus bar connecting a negative electrode of the capacitor series circuit and a negative electrode of the power conversion section, and an intermediate connection bus bar connecting in series two smoothing capacitors in the capacitor series circuit, are stacked in close contact with one another via insulating layers, to form a 4-layer bus bar. The two positive-electrode-side bus bars are not adjacent to each other and are connected in parallel to each other. The positive-electrode-side bus bar which is one of them and the negative-electrode-side bus bar are disposed adjacent to each other, thereby to reduce DC wiring inductances of the wiring structure in which the capacitor series circuit and the power conversion section are connected.

14 Claims, 14 Drawing Sheets

(56) References Cited

U.S. PATENT DOCUMENTS

| | | | | |
|---|---|---|---|---|
| 5,995,380 | A * | 11/1999 | Maue | B60R 16/0238 |
| | | | | 174/254 |
| 6,359,331 | B1 * | 3/2002 | Rinehart | H01L 23/642 |
| | | | | 257/691 |
| 7,248,483 | B2 * | 7/2007 | West | H02M 7/003 |
| | | | | 361/756 |
| 8,054,633 | B2 * | 11/2011 | Suwa | B60L 1/003 |
| | | | | 361/637 |
| 9,241,413 | B2 * | 1/2016 | Guerin | H02M 7/003 |
| 9,445,532 | B2 * | 9/2016 | Chen | H05K 7/209 |
| 2003/0031038 | A1 * | 2/2003 | Shirakawa | H02M 7/003 |
| | | | | 363/144 |
| 2006/0239050 | A1 * | 10/2006 | Andersson | H02M 7/003 |
| | | | | 363/132 |
| 2013/0271941 | A1 * | 10/2013 | Guan | H05K 7/1432 |
| | | | | 361/811 |

* cited by examiner

POWER CONVERSION DEVICE

TECHNICAL FIELD

The present invention relates to wiring structures of power conversion devices.

BACKGROUND ART

A conventional power conversion device includes: a capacitor series circuit which smooths DC voltage of a DC power supply circuit; and a power conversion section which converts the smoothed DC voltage into AC voltage by means of a semiconductor switching element. The conventional power conversion device also includes: a positive-electrode-side bus bar which connects the positive electrode of the capacitor series circuit and the positive electrode of the power conversion section; a negative-electrode-side bus bar which connects the negative electrode of the capacitor series circuit and the negative electrode of the power conversion section; and an intermediate connection bus bar which connects in series a first smoothing capacitor and a second smoothing capacitor. All the bus bars are formed so as to have substantially the same outer shape. In addition, the positive-electrode-side bus bar, the intermediate connection bus bar, and the negative-electrode-side bus bar are stacked with the intermediate connection bus bar interposed between the positive-electrode-side bus bar and the negative-electrode-side bus bar, thereby forming a three-layer structure. Accordingly, the current flows of adjacent bus bars are made opposite to each other, thereby allowing decrease of DC wiring inductances and reduction of spike voltage of the semiconductor switching element (see Patent Document 1, for example).

CITATION LIST

Patent Document

Patent Document 1: Japanese Laid-Open Patent Publication No. 2004-153951

SUMMARY OF THE INVENTION

Problems to be Solved by the Invention

In such a power conversion device, the intermediate connection bus bar is interposed between the positive-electrode-side bus bar and the negative-electrode-side bus bar in the three-layer structure. This results in a large distance between the positive-electrode-side bus bar connecting the positive electrodes of the capacitor series circuit and the power conversion section, and the negative-electrode-side bus bar connecting the negative electrodes of the capacitor series circuit and the power conversion section. Thus, there is a problem that inductance reducing effect is not sufficiently obtained.

The present invention has been made to resolve the above problem. An object of the present invention is to obtain a power conversion device that can promote reduction of DC wiring inductances.

Solution to the Problems

A power conversion device according to the present invention includes: a capacitor series circuit composed of a first smoothing capacitor and a second smoothing capacitor connected in series to each other; and a power conversion section including a plurality of semiconductor switching elements and for performing power conversion between DC power of the capacitor series circuit and AC power. The power conversion device also includes a first connection line connecting a positive electrode of the capacitor series circuit and a positive electrode of the power conversion section; a second connection line connecting a negative electrode of the capacitor series circuit and a negative electrode of the power conversion section; and a third connection line connecting in series the first smoothing capacitor and the second smoothing capacitor. One of the first and second connection lines is composed of two bus bars that are not adjacent to each other and that are connected in parallel to each other, the other of the first and second connection lines is composed of one bus bar disposed so as to be adjacent to one of the two bus bars connected in parallel to each other, the third connection line is composed of one bus bar, and the four bus bars in total are stacked in close contact with one another via insulating layers to form a stacked bus bar.

Effect of the Invention

Since the power conversion device according to the present invention is configured as described above, DC wiring inductances of the power conversion device can be greatly reduced. Accordingly, spike voltage which occurs at interruption of current of the semiconductor switching element can be suppressed, and deterioration of the semiconductor switching element can be prevented.

DESCRIPTION OF EMBODIMENTS

Embodiment 1

Figure 1:
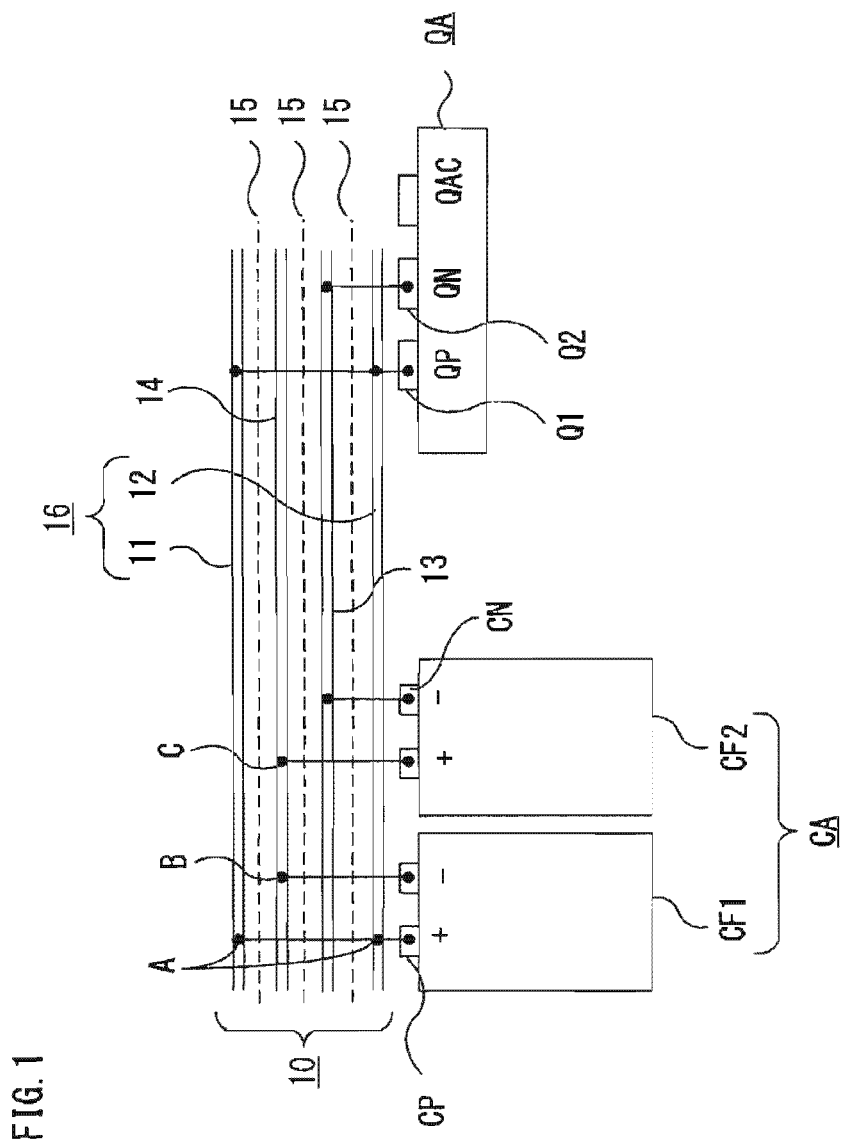
FIG. 1 is a side view showing the structure of a power conversion device according to Embodiment 1 of the present invention.
Figure 2:
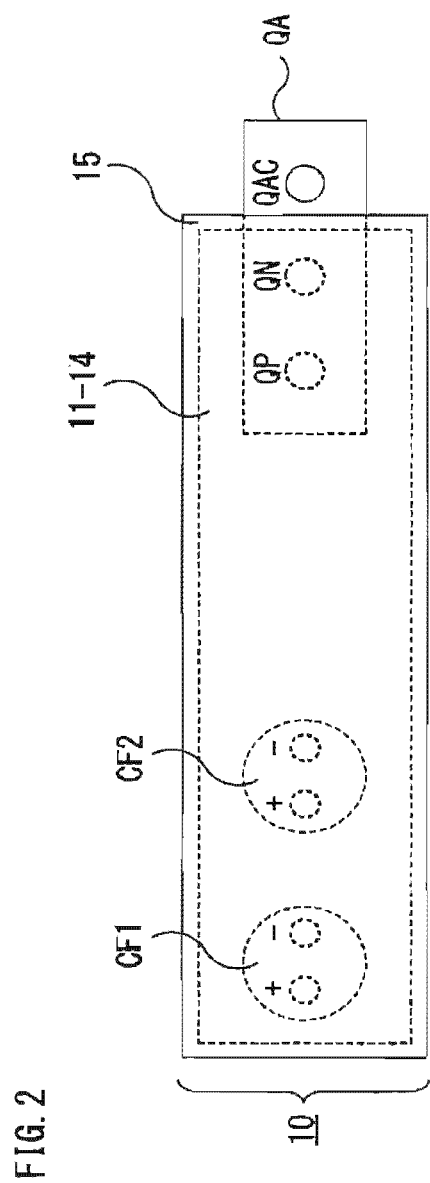
FIG. 2 is a plan view of the power conversion device shown in FIG. 1.
Figure 3:
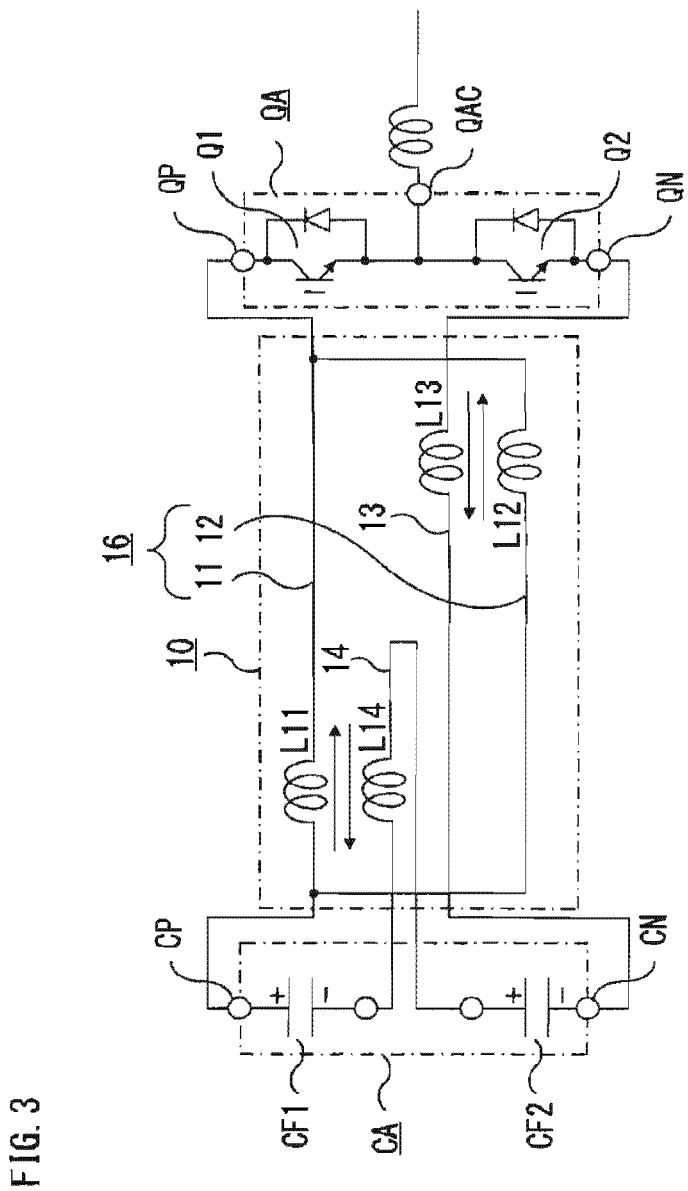
FIG. 3 is an equivalent circuit diagram of the power conversion device according to Embodiment 1 of the present invention.

Hereinafter, a power conversion device according to Embodiment 1 of the present invention will be described below with reference to FIG. 1 to FIG. 3. FIG. 1 is a side view showing the structure of the power conversion device according to Embodiment 1 of the present invention. FIG. 2 is a plan view of this power conversion device. FIG. 3 shows an equivalent circuit diagram of the power conversion device.

As shown in the drawings, the power conversion device includes a capacitor series circuit CA, a power conversion section QA, and a 4-layer bus bar 10 as a stacked bus bar.

The capacitor series circuit CA is composed of a smoothing capacitor CF1 as a first smoothing capacitor, and a smoothing capacitor CF2 as a second smoothing capacitor connected in series to each other. The capacitor series circuit CA includes a positive electrode CP and a negative electrode CN. The power conversion section QA is composed of two semiconductor switching elements Q1 and Q2 connected to each other, the semiconductor switching elements Q1 and Q2 each being an IGBT module, for example. The power conversion section QA includes a positive electrode QP, a negative electrode QN, and an output terminal QAC, and outputs 2-level AC voltage. In this example, the power conversion section QA is described as a power conversion section that converts DC power of the capacitor series circuit CA into AC power. However, the power conversion section QA may be a power conversion section that converts AC power into DC power.

The 4-layer bus bar 10 is composed of four bus bars 11 to 14, which are two positive-electrode-side bus bars 11 and 12, one negative-electrode-side bus bar 13, and one intermediate connection bus bar 14, stacked in close contact with one another with insulating layers 15 respectively disposed between the bus bars 11 to 14. In addition, the four bus bars 11 to 14 are formed so as to have substantially the same outer shape.

The two positive-electrode-side bus bars 11 and 12 are disposed at the first layer and the fourth layer and connected in parallel to each other, to form a first connection line 16 which connects the positive electrode CP of the capacitor series circuit CA and the positive electrode QP of the power conversion section QA. The negative-electrode-side bus bar 13 is disposed at the third layer, to form a second connection line which connects the negative electrode CN of the capacitor series circuit CA and the negative electrode QN of the power conversion section QA. The intermediate connection bus bar 14 is disposed at the second layer, to form a third connection line which connects in series (the negative electrode of) the smoothing capacitor CF1 and (the positive electrode of) the smoothing capacitor CF2.

In this manner, the two positive-electrode-side bus bars 11 and 12 are disposed with the negative-electrode-side bus bar 13 and the intermediate connection bus bar 14 which are interposed therebetween.

The capacitor series circuit CA is connected to a first side (left side in the drawings) in the longitudinal direction of the 4-layer bus bar 10, and the power conversion section QA is connected to a second side in the longitudinal direction of the stacked bus bar. The smoothing capacitor CF1 on the positive electrode CP side of the capacitor series circuit CA is disposed farther from the power conversion section QA than the smoothing capacitor CF2 on the negative electrode CN side. Thus, connection points A for connecting the positive electrode CP of the capacitor series circuit CA and the positive-electrode-side bus bars 11 and 12, a connection point B for connecting the smoothing capacitor CF1 and the intermediate connection bus bar 14, and a connection point C for connecting the smoothing capacitor CF2 and the intermediate connection bus bar 14 are arranged in the order of the connection points A, the connection point B, and the connection point C, from the first side end in the longitudinal direction of the 4-layer bus bar 10 toward the second side thereof.

FIG. 3 shows an inductance L11 of the positive-electrode-side bus bar 11, an inductance L12 of the positive-electrode-side bus bar 12, an inductance L13 of the negative-electrode-side bus bar 13, an inductance L14 of the intermediate connection bus bar 14, and arrows indicating the directions of currents respectively flowing in the bus bars 11 to 14.

As shown in FIG. 3, the positive-electrode-side bus bar 12 and the negative-electrode-side bus bar 13 are adjacent to each other, and in addition, their current flowing directions are opposite to each other. Moreover, the positive-electrode-side bus bar 11 and the intermediate connection bus bar 14 are adjacent to each other, and in addition, their current flowing directions are opposite to each other.

In this manner, the directions of the currents flowing in the bus bars that are adjacent to each other can be made opposite to each other, and thus, DC wiring inductances can be canceled with each other to be reduced. Therefore, spike voltage which occurs at interruption of current of the semiconductor switching element Q1, Q2 of the power conversion section QA can be suppressed, and deterioration of the semiconductor switching element Q1, Q2 can be prevented.

Since the bus bars 11 to 14 are formed so as to have substantially the same outer shape, alignment for forming the 4-layer bus bar 10 is easy, and thus, production thereof is easy. Therefore, the DC wiring inductance reducing effect as described above can be easily attained.

In this embodiment, the negative-electrode-side bus bar 13 is disposed at the third layer, and the intermediate connection bus bar 14 is disposed at the second layer. However, the negative-electrode-side bus bar 13 may be disposed at the second layer, and the intermediate connection bus bar 14 may be disposed at the third layer. Such a structure also has the same effect.

Embodiment 2

Figure 4:
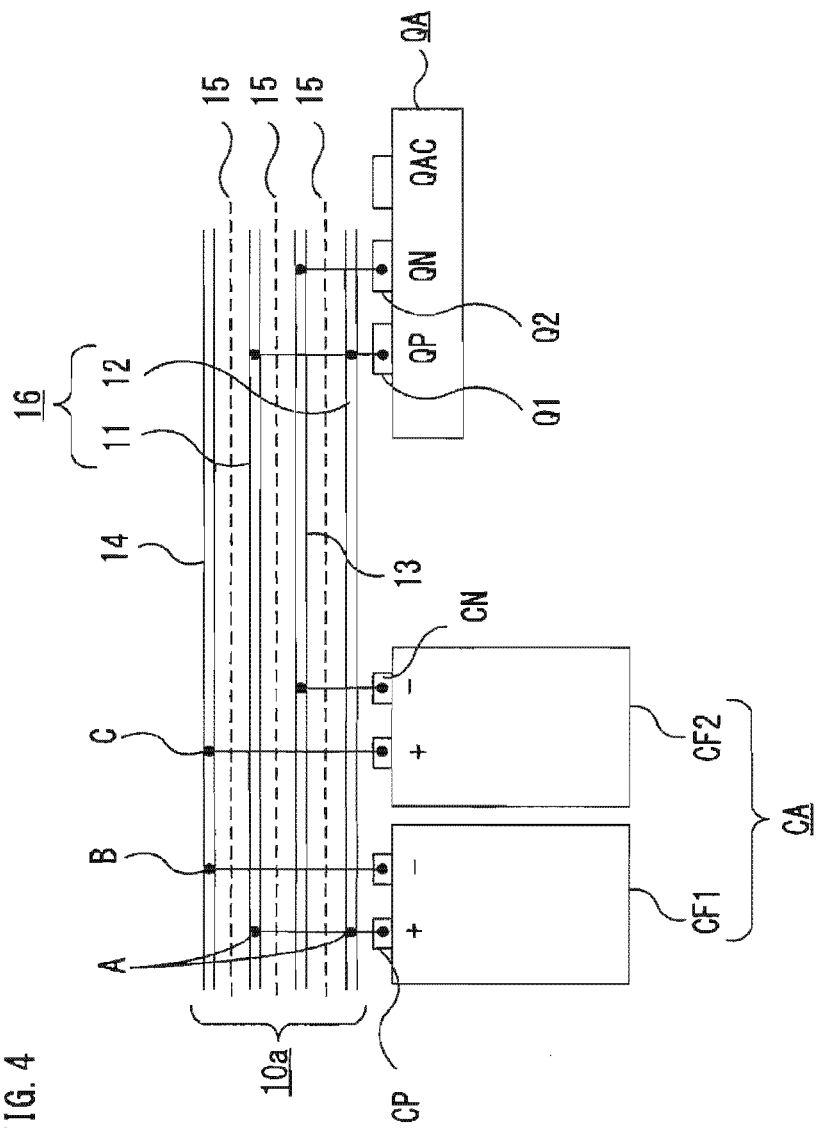
FIG. 4 is a side view showing the structure of a power conversion device according to Embodiment 2 of the present invention.
Figure 5:
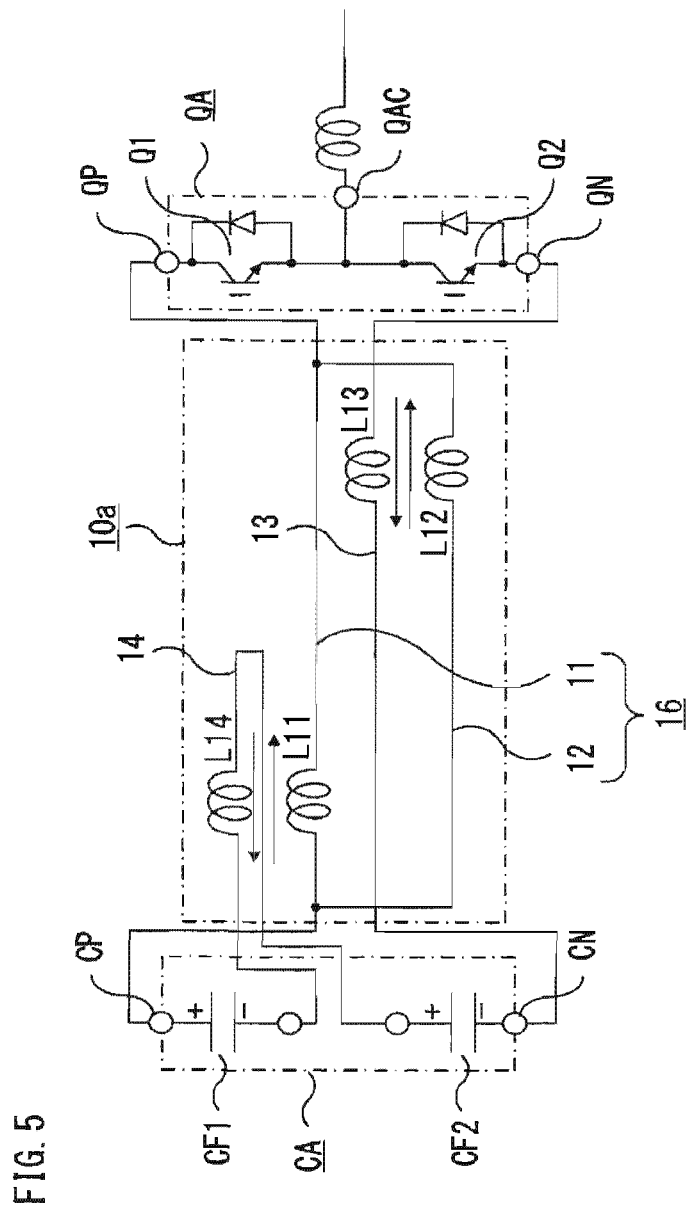
FIG. 5 is an equivalent circuit diagram of the power conversion device according to Embodiment 2 of the present invention.

Next, a power conversion device according to Embodiment 2 of the present invention will be described below with reference to FIG. 4 and FIG. 5. FIG. 4 is a side view showing the structure of the power conversion device according to Embodiment 2 of the present invention. FIG. 5 shows an equivalent circuit diagram of this power conversion device. The plan view of this power conversion device is the same as that shown in FIG. 2 regarding Embodiment 1.

In Embodiment 2, the two positive-electrode-side bus bars 11 and 12 forming the first connection line 16 are disposed at the second layer and the fourth layer, the negative-electrode-side bus bar 13 forming the second connection line is disposed at the third layer, and the intermediate connection bus bar 14 forming the third connection line is disposed at the first layer, whereby a 4-layer bus bar 10*a* as a stacked bus bar is formed. That is, the two positive-electrode-side bus bars 11 and 12 are disposed with the negative-electrode-side bus bar 13 interposed therebetween, and the intermediate connection bus bar 14 is disposed outside thereof. The other structures are the same as those in Embodiment 1.

FIG. 5 shows the inductance L11 of the positive-electrode-side bus bar 11, the inductance L12 of the positive-electrode-side bus bar 12, the inductance L13 of the negative-electrode-side bus bar 13, the inductance L14 of the intermediate connection bus bar 14, and arrows indicating the directions of currents respectively flowing in the bus bars 11 to 14.

As shown in FIG. 5, the positive-electrode-side bus bar 12 and the negative-electrode-side bus bar 13 are adjacent to each other, and in addition, their current flowing directions are opposite to each other. Moreover, the positive-electrode-side bus bar 11 and the intermediate connection bus bar 14 are adjacent to each other, and in addition, their current flowing directions are opposite to each other.

Also in Embodiment 2, the directions of the currents flowing in the bus bars that are adjacent to each other can be made opposite to each other, and thus, DC wiring inductances can be canceled with each other to be reduced. Therefore, similarly to Embodiment 1, spike voltage which occurs at interruption of current of the semiconductor switching element Q1, Q2 of the power conversion section QA can be suppressed, and deterioration of the semiconductor switching element Q1, Q2 can be prevented. Since the bus bars 11 to 14 are formed so as to have substantially the same outer shape, alignment for forming the 4-layer bus bar 10*a* is easy, and thus, production thereof is easy. Therefore, the DC wiring inductance reducing effect as described above can be easily attained.

It is noted that the positive-electrode-side bus bars 11 and 12 may be disposed at the first layer and the third layer, the negative-electrode-side bus bar 13 may be disposed at the second layer therebetween, and the intermediate connection bus bar 14 may be disposed at the fourth layer. Such a structure also has the same effect.

Embodiment 3

Figure 6:
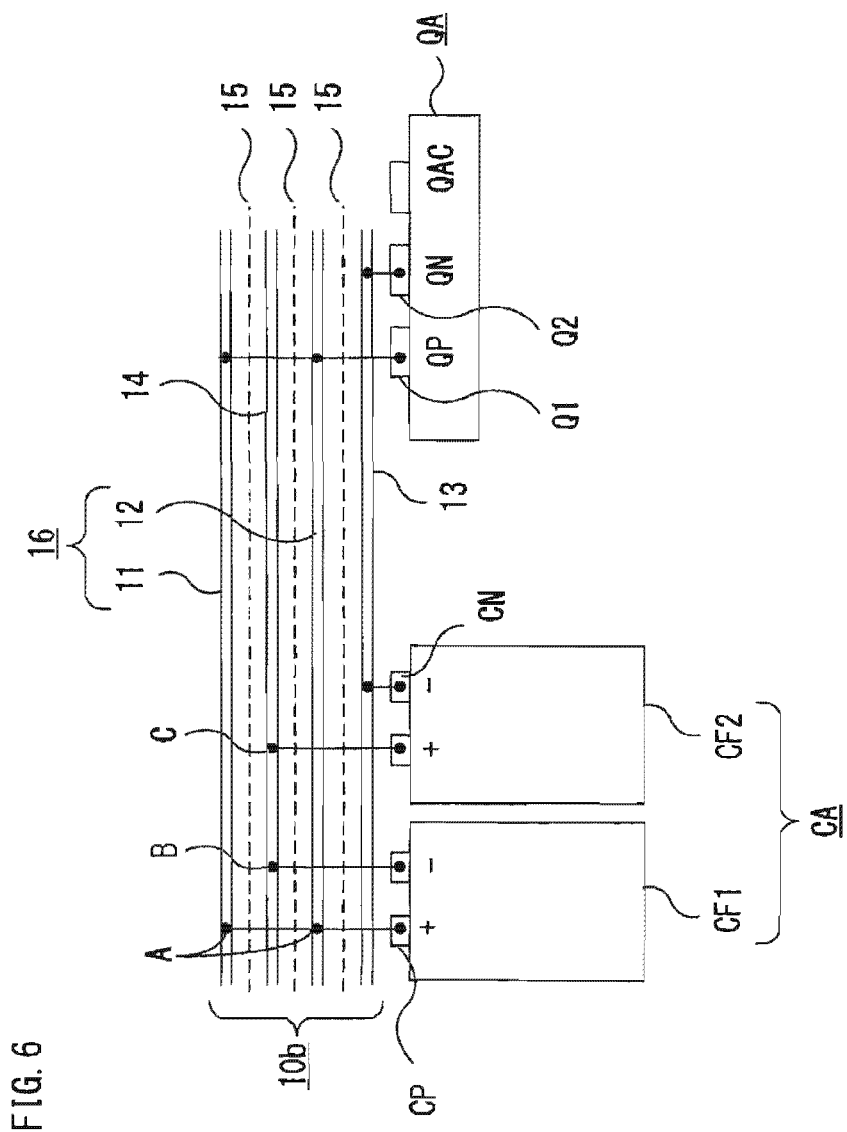
FIG. 6 is a side view showing the structure of a power conversion device according to Embodiment 3 of the present invention.
Figure 7:
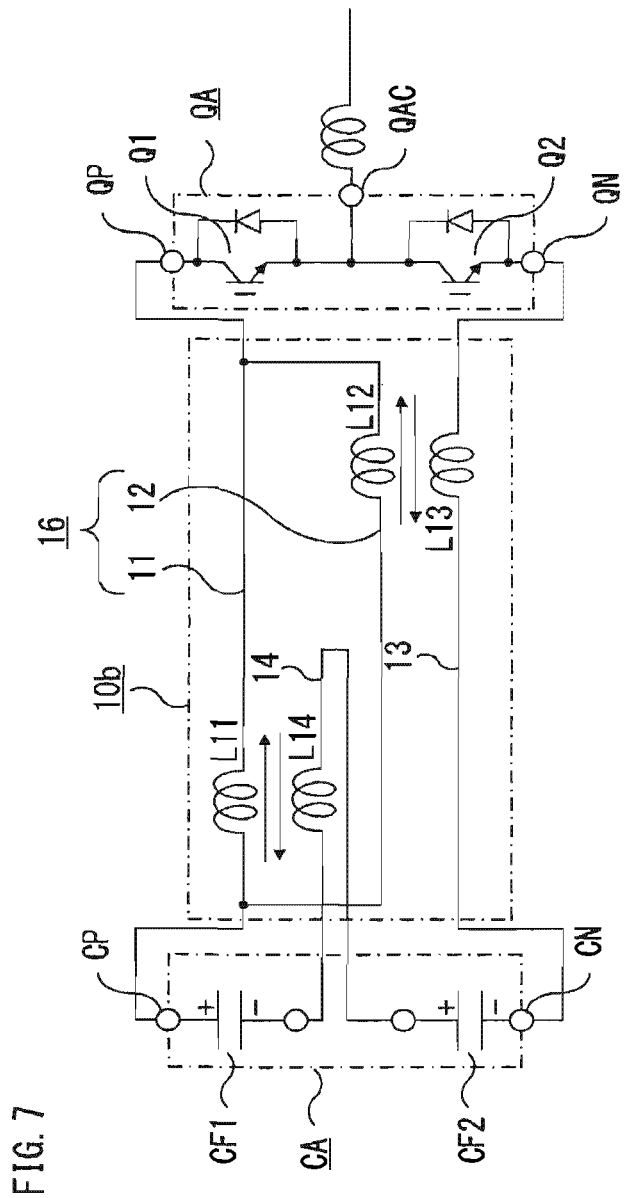
FIG. 7 is an equivalent circuit diagram of the power conversion device according to Embodiment 3 of the present invention.

Next, a power conversion device according to Embodiment 3 of the present invention will be described below with reference to FIG. 6 and FIG. 7. FIG. 6 is a side view showing the structure of the power conversion device according to Embodiment 3 of the present invention. FIG. 7 shows an equivalent circuit diagram of this power conversion device. The plan view of this power conversion device is the same as that shown in FIG. 2 regarding Embodiment 1.

In Embodiment 3, the two positive-electrode-side bus bars 11 and 12 forming the first connection line 16 are disposed at the first layer and the third layer, the negative-electrode-side bus bar 13 forming the second connection line is disposed at the fourth layer, and the intermediate connection bus bar 14 forming the third connection line is disposed at the second layer, whereby a 4-layer bus bar 10*b* as a stacked bus bar is formed. That is, the two positive-electrode-side bus bars 11 and 12 are disposed with the intermediate connection bus bar 14 interposed therebetween, and the negative-electrode-side bus bar 13 is disposed outside thereof. The other structures are the same as those in Embodiment 1.

FIG. 7 shows the inductance L11 of the positive-electrode-side bus bar 11, the inductance L12 of the positive-electrode-side bus bar 12, the inductance L13 of the negative-electrode-side bus bar 13, the inductance L14 of the intermediate connection bus bar 14, and arrows indicating the directions of currents respectively flowing in the bus bars 11 to 14.

As shown in FIG. 7, the positive-electrode-side bus bar 12 and the negative-electrode-side bus bar 13 are adjacent to each other, and in addition, their current flowing directions are opposite to each other. Moreover, the positive-electrode-side bus bar 11 and the intermediate connection bus bar 14 are adjacent to each other, and in addition, their current flowing directions are opposite to each other.

Also in Embodiment 3, the directions of the currents flowing in the bus bars that are adjacent to each other can be made opposite to each other, and thus, DC wiring inductances can be canceled with each other to be reduced. Therefore, similarly to Embodiment 1, spike voltage which occurs at interruption of current of the semiconductor switching element Q1, Q2 of the power conversion section QA can be suppressed, and deterioration of the semiconductor switching element Q1, Q2 can be prevented. Since the bus bars 11 to 14 are formed so as to have substantially the same outer shape, alignment for forming the 4-layer bus bar 10*b* is easy, and thus, production thereof is easy. Therefore, the DC wiring inductance reducing effect as described above can be easily attained.

It is noted that the positive-electrode-side bus bars 11 and 12 may be disposed at the second layer and the fourth layer, the intermediate connection bus bar 14 may be disposed at the third layer therebetween, and the negative-electrode-side bus bar 13 may be disposed at the first layer. Such a structure also has the same effect.

Embodiment 4

Figure 8:
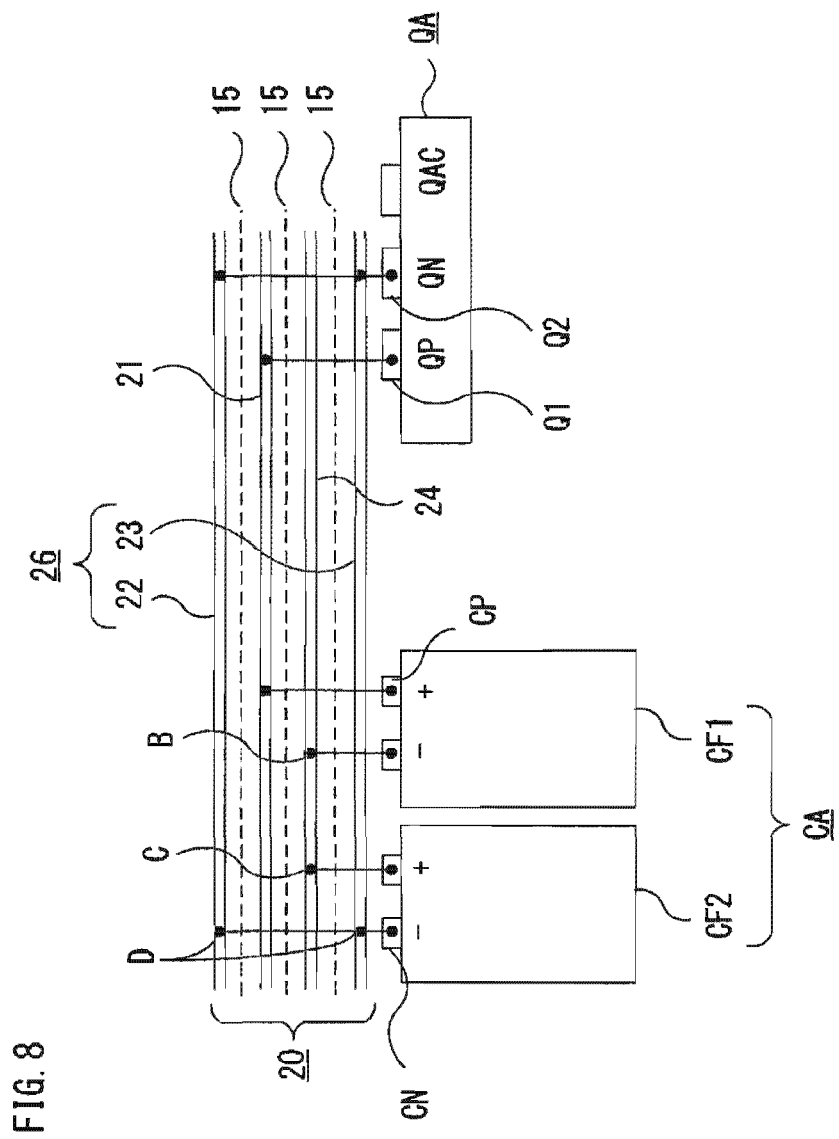
FIG. 8 is a side view showing the structure of a power conversion device according to Embodiment 4 of the present invention.
Figure 9:
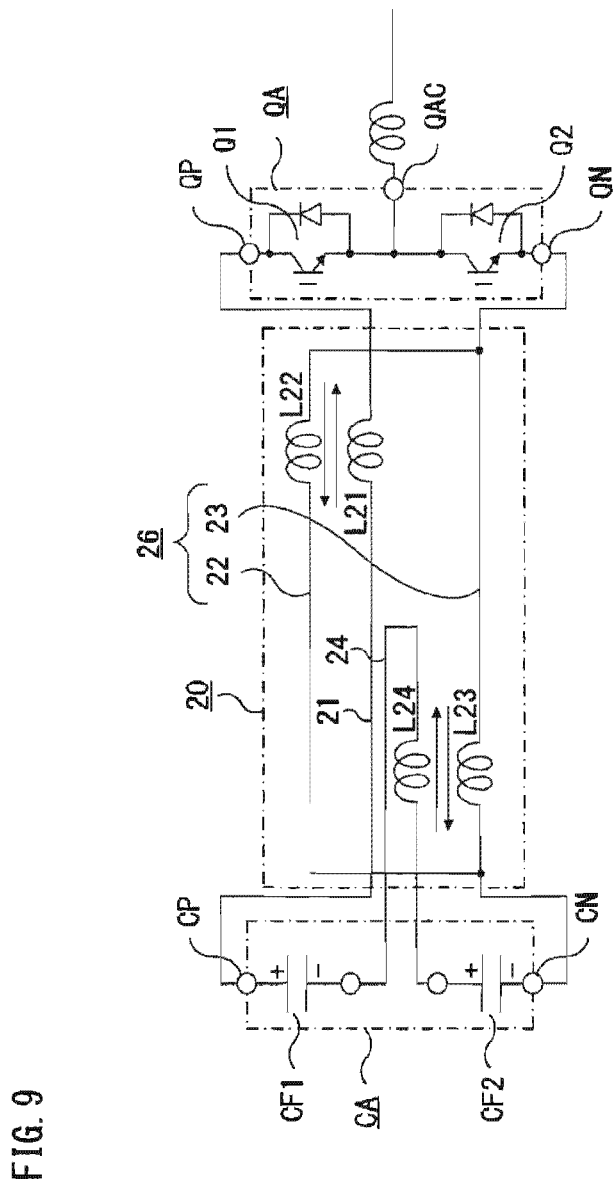
FIG. 9 is an equivalent circuit diagram of the power conversion device according to Embodiment 4 of the present invention.

Next, a power conversion device according to Embodiment 4 of the present invention will be described below with reference to FIG. 8 and FIG. 9. FIG. 8 is a side view showing the structure of the power conversion device according to Embodiment 4 of the present invention. FIG. 9 shows an equivalent circuit diagram of this power conversion device.

The power conversion device includes the capacitor series circuit CA, the power conversion section QA, and a 4-layer bus bar 20 as a stacked bus bar. The capacitor series circuit CA and the power conversion section QA are the same as those in Embodiment 1.

The 4-layer bus bar 20 is composed of four bus bars 21 to 24, which are one positive-electrode-side bus bar 21, two negative-electrode-side bus bars 22 and 23, and one intermediate connection bus bar 24, stacked in close contact with one another with insulating layers 15 respectively disposed between the bus bars 21 to 24. In addition, the four bus bars 21 to 24 are formed so as to have substantially the same outer shape.

The two negative-electrode-side bus bars 22 and 23 are disposed at the first layer and the fourth layer and connected in parallel to each other, to form a second connection line 26 which connects the negative electrode CN of the capacitor series circuit CA and the negative electrode QN of the power conversion section QA. The positive-electrode-side bus bar 21 is disposed at the second layer, to form a first connection line which connects the positive electrode CP of the capacitor series circuit CA and the positive electrode QP of the power conversion section QA. The intermediate connection bus bar 24 is disposed at the third layer, to form a third connection line which connects in series (the negative electrode of) the smoothing capacitor CF1 and (the positive electrode of) the smoothing capacitor CF2.

In this manner, the two negative-electrode-side bus bars 22 and 23 are disposed with the positive-electrode-side bus bar 21 and the intermediate connection bus bar 24 which are interposed therebetween.

The capacitor series circuit CA is connected to the first side (left side in the drawings) in the longitudinal direction of the 4-layer bus bar 10, and the power conversion section QA is connected to the second side in the longitudinal direction of the stacked bus bar. The smoothing capacitor CF2 on the negative electrode CN side of the capacitor series circuit CA is disposed farther from the power conversion section QA than the smoothing capacitor CF1 on the positive electrode CP side. Thus, connection points D for connecting the negative electrode CN of the capacitor series circuit CA and the negative-electrode-side bus bars 22 and 23, a connection point C for connecting the smoothing capacitor CF2 and the intermediate connection bus bar 24, and a connection point B for connecting the smoothing capacitor CF1 and the intermediate connection bus bar 24 are arranged in the order of the connection points D, the connection point C, and the connection point B, from the first side end in the longitudinal direction of the 4-layer bus bar 20 toward the second side thereof.

FIG. 9 shows an inductance L21 of the positive-electrode-side bus bar 21, an inductance L22 of the negative-electrode-side bus bar 22, an inductance L23 of the negative-electrode-side bus bar 23, an inductance L24 of the intermediate connection bus bar 24, and arrows indicating the directions of currents respectively flowing in the bus bars 21 to 24.

As shown in FIG. 9, the positive-electrode-side bus bar 21 and the negative-electrode-side bus bar 22 are adjacent to each other, and in addition, their current flowing directions are opposite to each other. Moreover, the negative-electrode-side bus bar 23 and the intermediate connection bus bar 24 are adjacent to each other, and in addition, their current flowing directions are opposite to each other.

Also in Embodiment 4, the directions of the currents flowing in the bus bars that are adjacent to each other can be made opposite to each other, and thus, DC wiring inductances can be canceled with each other to be reduced. Therefore, similarly to Embodiment 1, spike voltage which occurs at interruption of current of the semiconductor switching element Q1, Q2 of the power conversion section QA can be suppressed, and deterioration of the semiconductor switching element Q1, Q2 can be prevented. Since the bus bars 21 to 24 are formed so as to have substantially the same outer shape, alignment for forming the 4-layer bus bar 20 is easy, and thus, production thereof is easy. Therefore, the DC wiring inductance reducing effect as described above can be easily attained.

In this embodiment, the positive-electrode-side bus bar 21 is disposed at the second layer, and the intermediate connection bus bar 24 is disposed at the third layer. However, the positive-electrode-side bus bar 21 may be disposed at the third layer, and the intermediate connection bus bar 24 may be disposed at the second layer. Such a structure also has the same effect.

Embodiment 5

Figure 10:
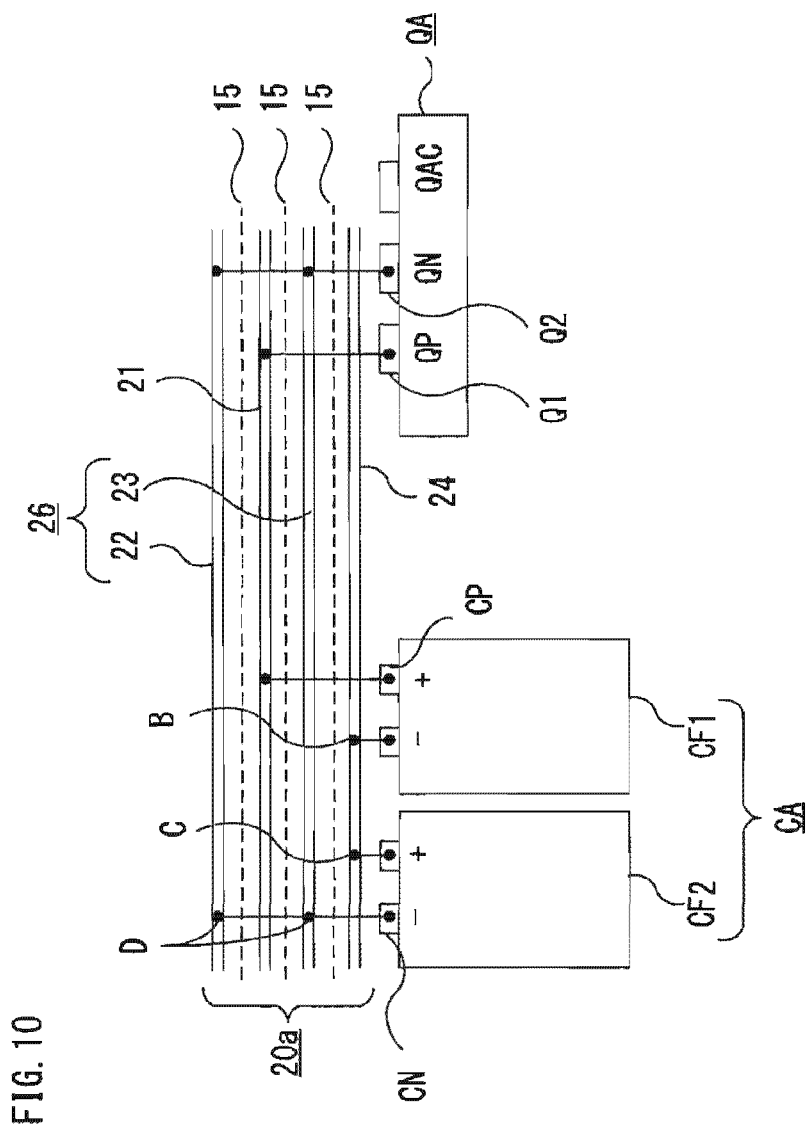
FIG. 10 is a side view showing the structure of a power conversion device according to Embodiment 5 of the present invention.
Figure 11:
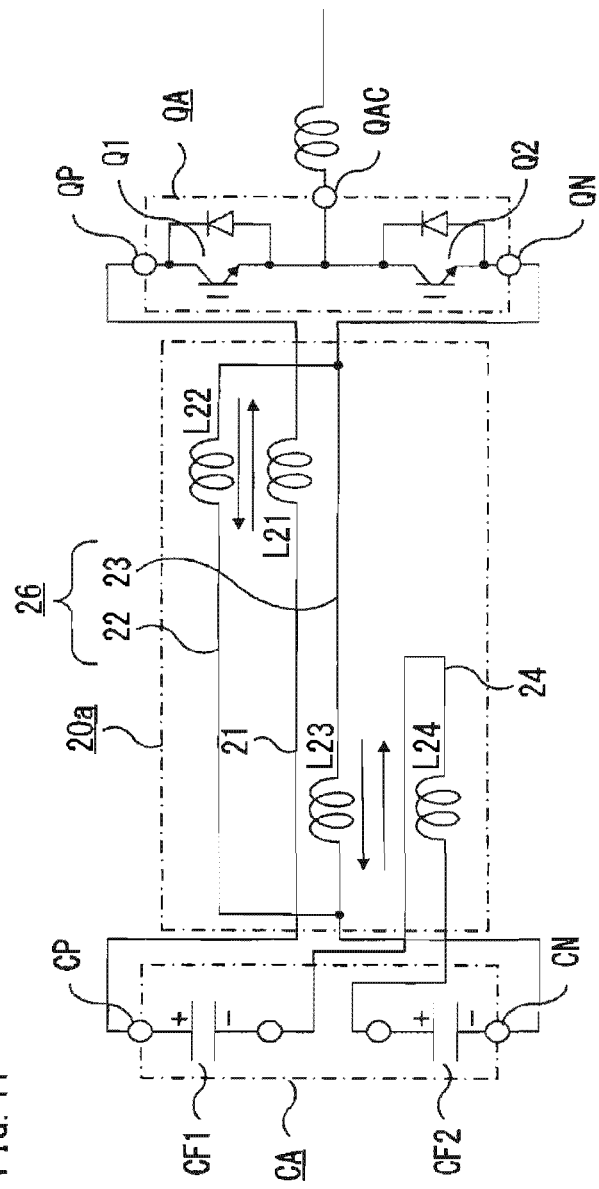
FIG. 11 is an equivalent circuit diagram of the power conversion device according to Embodiment 5 of the present invention.

Next, a power conversion device according to Embodiment 5 of the present invention will be described below with reference to FIG. 10 and FIG. 11. FIG. 10 is a side view showing the structure of the power conversion device according to Embodiment 5 of the present invention. FIG. 11 shows an equivalent circuit diagram of this power conversion device.

In Embodiment 5, the two negative-electrode-side bus bars 22 and 23 forming the second connection line 26 are disposed at the first layer and the third layer, the positive-electrode-side bus bar 21 forming the first connection line is disposed at the second layer, the intermediate connection bus bar 24 forming the third connection line is disposed at the fourth layer, whereby a 4-layer bus bar 20a as a stacked bus bar is formed. That is, the two negative-electrode-side bus bars 22 and 23 are disposed with the positive-electrode-side bus bar 21 interposed therebetween, and the intermediate connection bus bar 24 is disposed outside thereof. The other structures are the same as those in Embodiment 4.

FIG. 11 shows the inductance L21 of the positive-electrode-side bus bar 21, the inductance L22 of the negative-electrode-side bus bar 22, the inductance L23 of the negative-electrode-side bus bar 23, the inductance L24 of the intermediate connection bus bar 24, and arrows indicating the directions of currents respectively flowing in the bus bars 21 to 24.

As shown in FIG. 11, the positive-electrode-side bus bar 21 and the negative-electrode-side bus bar 22 are adjacent to each other, and in addition, their current flowing directions are opposite to each other. Moreover, the negative-electrode-side bus bar 23 and the intermediate connection bus bar 24 are adjacent to each other, and in addition, their current flowing directions are opposite to each other.

Also in Embodiment 5, the directions of the currents flowing in the bus bars that are adjacent to each other can be made opposite to each other, and thus, DC wiring inductances can be canceled with each other to be reduced. Therefore, similarly to Embodiment 1, spike voltage which occurs at interruption of current of the semiconductor switching element Q1, Q2 of the power conversion section QA can be suppressed, and deterioration of the semiconductor switching element Q1, Q2 can be prevented. Since the bus bars 21 to 24 are formed so as to have substantially the same outer shape, alignment for forming the 4-layer bus bar 20a is easy, and thus, production thereof is easy. Therefore, the DC wiring inductance reducing effect as described above can be easily attained.

It is noted that the negative-electrode-side bus bars 22 and 23 may be disposed at the second layer and the fourth layer, the positive-electrode-side bus bar 21 may be disposed at the third layer therebetween, and the intermediate connection bus bar 24 may be disposed at the first layer. Such a structure also has the same effect.

Embodiment 6

Figure 12:
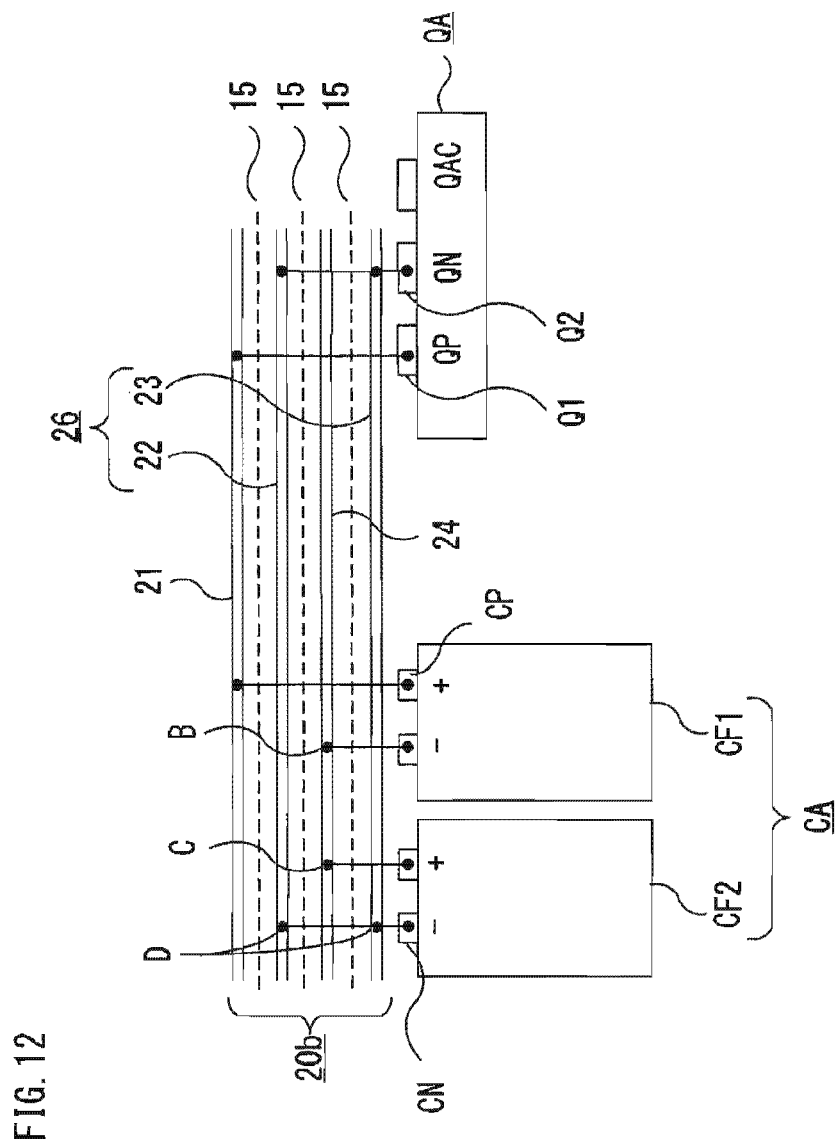
FIG. 12 is a side view showing the structure of a power conversion device according to Embodiment 6 of the present invention.
Figure 13:
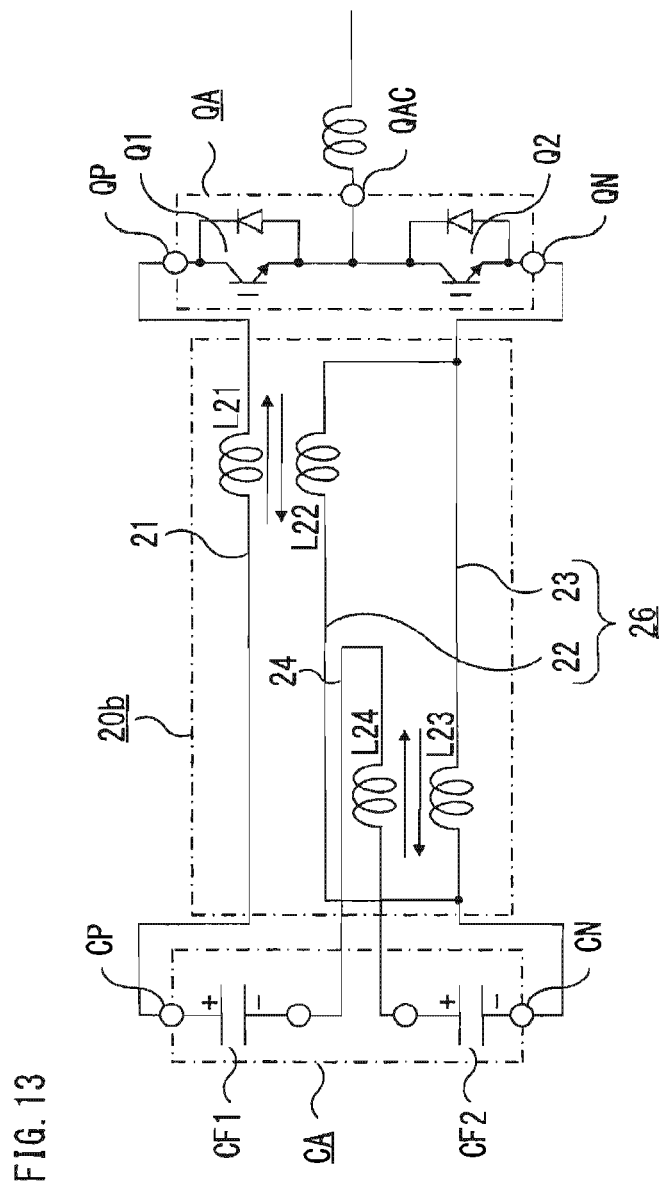
FIG. 13 is an equivalent circuit diagram of the power conversion device according to Embodiment 6 of the present invention.

Next, a power conversion device according to Embodiment 6 of the present invention will be described below with reference to FIG. 12 and FIG. 13. FIG. 12 is a side view showing the structure of the power conversion device according to Embodiment 6 of the present invention. FIG. 13 shows an equivalent circuit diagram of this power conversion device.

In Embodiment 6, the two negative-electrode-side bus bars 22 and 23 forming the second connection line 26 are disposed at the second layer and the fourth layer, the positive-electrode-side bus bar 21 forming the first connection line is disposed at the first layer, and the intermediate connection bus bar 24 forming the third connection line is disposed at the third layer, whereby a 4-layer bus bar 20b as a stacked bus bar is formed. That is, the two negative-electrode-side bus bars 22 and 23 are disposed with the intermediate connection bus bar 24 interposed therebetween, and the positive-electrode-side bus bar 21 is disposed outside thereof. The other structures are the same as those in Embodiment 4.

FIG. 13 shows the inductance L21 of the positive-electrode-side bus bar 21, the inductance L22 of the negative-electrode-side bus bar 22, the inductance L23 of the negative-electrode-side bus bar 23, the inductance L24 of the intermediate connection bus bar 24, and arrows indicating the directions of currents respectively flowing in the bus bars 21 to 24.

As shown in FIG. 13, the positive-electrode-side bus bar 21 and the negative-electrode-side bus bar 22 are adjacent to each other, and in addition, their current flowing directions are opposite to each other. Moreover, the negative-electrode-side bus bar 23 and the intermediate connection bus bar 24 are adjacent to each other, and in addition, their current flowing directions are opposite to each other.

Also in Embodiment 6, the directions of the currents flowing in the bus bars that are adjacent to each other can be made opposite to each other, and thus, DC wiring inductances can be canceled with each other to be reduced. Therefore, similarly to Embodiment 1, spike voltage which occurs at interruption of current of the semiconductor switching element Q1, Q2 of the power conversion section QA can be suppressed, and deterioration of the semiconductor switching element Q1, Q2 can be prevented. Since the bus bars 21 to 24 are formed so as to have substantially the same outer shape, alignment for forming the 4-layer bus bar 20b is easy, and thus, production thereof is easy. Therefore, the DC wiring inductance reducing effect as described above can be easily attained.

It is noted that the negative-electrode-side bus bars 22 and 23 may be disposed at the first layer and the third layer, the intermediate connection bus bar 24 may be disposed at the second layer therebetween, and the positive-electrode-side bus bar 21 may be disposed at the fourth layer. Such a structure also has the same effect.

Embodiment 7

In Embodiments 1 to 6, the four bus bars 11 to 14 (21 to 24) are formed so as to have substantially the same outer shape, but the four bus bars 11 to 14 (21 to 24) may be formed so as to have different outer shapes.

Figure 14:
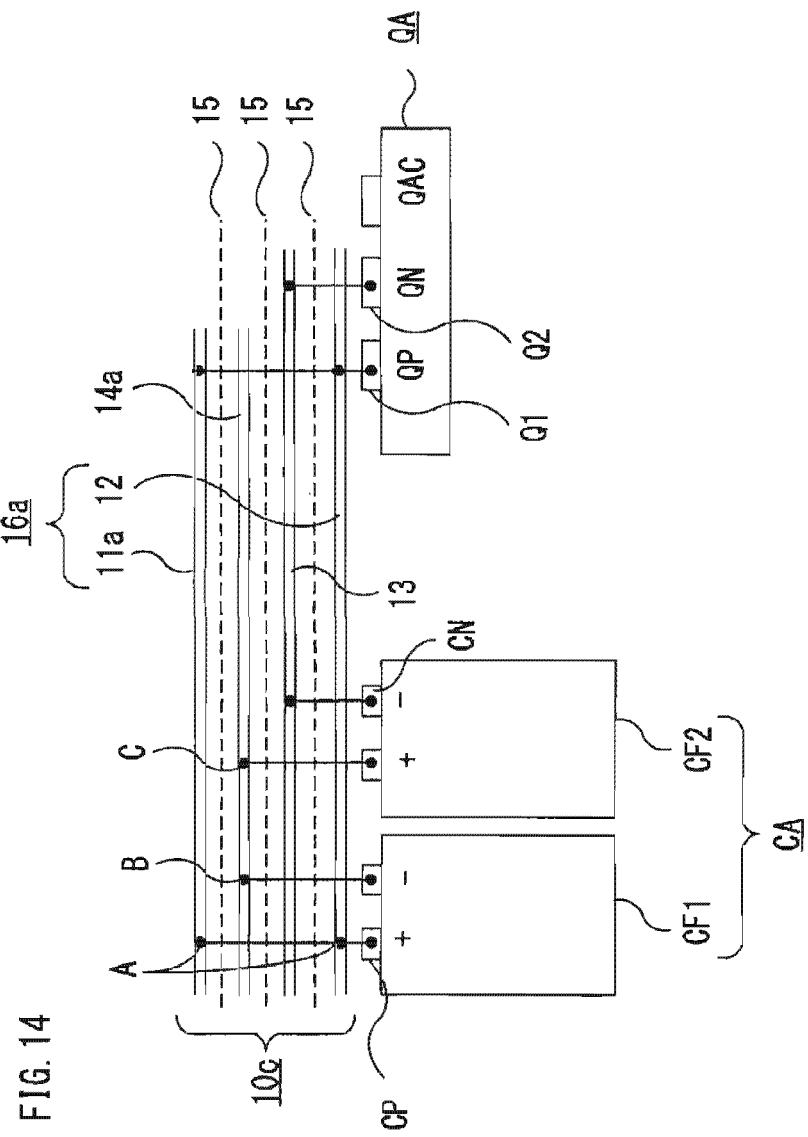
FIG. 14 is a side view showing the structure of a power conversion device according to Embodiment 7 of the present invention.

FIG. 14 is a side view showing the structure of a power conversion device according to Embodiment 7 of the present invention. As shown in FIG. 14, a 4-layer bus bar 10c is composed of four bus bars 11a, 12, 13, and 14a, which are two positive-electrode-side bus bars 11a and 12, one negative-electrode-side bus bar 13, and one intermediate connection bus bar 14a, stacked in close contact with one another with insulating layers 15 respectively disposed between the bus bars 11a, 12, 13, and 14a. The two positive-electrode-side bus bars 11a and 12 are disposed at the first layer and the fourth layer and connected in parallel to each other, to form a first connection line 16a which connects the positive electrode CP of the capacitor series circuit CA and the positive electrode QP of the power conversion section QA. The negative-electrode-side bus bar 13 is disposed at the third layer, to form a second connection line which connects the negative electrode CN of the capacitor series circuit CA and the negative electrode QN of the power conversion section QA. The intermediate connection bus bar 14a is disposed at the second layer, to form a third connection line which connects in series (the negative electrode of) the smoothing capacitor CF1 and (the positive electrode of) the smoothing capacitor CF2. In this case, the positive-electrode-side bus bar 11a disposed at the first layer and the intermediate connection bus bar 14a disposed at the second layer are formed so as to be shorter than the other bus bars 12 and 13. The other structures are the same as those in Embodiment 1.

Although the positive-electrode-side bus bar 11a and the intermediate connection bus bar 14a are shorter than those in Embodiment 1, the regions that have been cut are neither regions that are relevant to connection between the capacitor series circuit CA and the power conversion section QA, nor regions in which currents relevant to reduction of DC wiring inductances flow. Therefore, the directions of the currents flowing in the bus bars that are adjacent to each other can be made opposite to each other, and DC wiring inductances can be canceled with each other to be reduced. Thus, the same effect as in Embodiment 1 can be obtained, and cost reduction and weight reduction can be realized.

The sizes of regions that are cut in the positive-electrode-side bus bar 11a and the intermediate connection bus bar 14a are determined such that rise of wiring inductances due to reduction of the areas of the bus bars 11a and 14a does not cause adverse effects.

In this embodiment, a modification of the 4-layer bus bar 10 of Embodiment 1 has been shown, but the 4-layer bus bars according to Embodiments 2 to 6 may be modified in a similar manner.

It is noted that, within the scope of the present invention, the above embodiments may be freely combined, modified, or abbreviated as appropriate.

The invention claimed is:

1. A power conversion device comprising:
   a capacitor series circuit composed of a first smoothing capacitor and a second smoothing capacitor connected in series to each other; and
   a power conversion section including a plurality of semiconductor switching elements and for performing power conversion between DC power of the capacitor series circuit and AC power,
   the power conversion device further comprising:
      a first connection line connecting a positive electrode of the capacitor series circuit and a positive electrode of the power conversion section;
      a second connection line connecting a negative electrode of the capacitor series circuit and a negative electrode of the power conversion section; and
      a third connection line connecting in series the first smoothing capacitor and the second smoothing capacitor, wherein
   one of the first and second connection lines is composed of two bus bars that are not adjacent to each other and that are connected in parallel to each other, the other of the first and second connection lines is composed of one bus bar disposed so as to be adjacent to one of the two bus bars connected in parallel to each other, the third connection line is composed of one bus bar, and the four bus bars in total are stacked in close contact with one another via insulating layers to form a stacked bus bar.

2. The power conversion device according to claim 1, wherein
   the four bus bars are disposed such that directions in which currents flow in bus bars that are adjacent to each other are opposite to each other.

3. The power conversion device according to claim 1, wherein
the first connection line is composed of the two bus bars connected in parallel to each other, and the bus bar of the second connection line and the bus bar of the third connection line are disposed between the two bus bars.

4. The power conversion device according to claim 1, wherein
the first connection line is composed of the two bus bars connected in parallel to each other, the bus bar of one of the second and third connection lines is disposed between the two bus bars, and the bus bar of the other of the second and third connection lines is disposed outside of the two bus bars.

5. The power conversion device according to claim 1, wherein
the first connection line is composed of the two bus bars connected in parallel to each other, and
the capacitor series circuit is connected to a first side in a longitudinal direction of the stacked bus bar, the power conversion section is connected to a second side in the longitudinal direction of the stacked bus bar, and connection points A for connecting the positive electrode of the capacitor series circuit and the bus bars of the first connection line, a connection point B for connecting the first smoothing capacitor and the bus bar of the third connection line, and a connection point C for connecting the second smoothing capacitor and the bus bar of the third connection line are arranged in an order of the connection points A, the connection point B, and the connection point C from the first side end of the stacked bus bar toward the second side thereof.

6. The power conversion device according to claim 1, wherein
the second connection line is composed of the two bus bars connected in parallel to each other, and the bus bar of the first connection line and the bus bar of the third connection line are disposed between the two bus bars.

7. The power conversion device according to claim 1, wherein
the second connection line is composed of the two bus bars connected in parallel to each other, the bus bar of one of the first and third connection lines is disposed between the two bus bars, and the bus bar of the other of the first and third connection lines is disposed outside of the two bus bars.

8. The power conversion device according to claim 1, wherein
the second connection line is composed of the two bus bars connected in parallel to each other, and
the capacitor series circuit is connected to a first side in a longitudinal direction of the stacked bus bar, the power conversion section is connected to a second side in the longitudinal direction of the stacked bus bar, and connection points D for connecting the negative electrode of the capacitor series circuit and the bus bars of the second connection line, a connection point B for connecting the first smoothing capacitor and the bus bar of the third connection line, and a connection point C for connecting the second smoothing capacitor and the bus bar of the third connection line are arranged in an order of the connection points D, the connection point C, and the connection point B, from the first side end of the stacked bus bar toward the second side thereof.

9. The power conversion device according to claim 2, wherein
the first connection line is composed of the two bus bars connected in parallel to each other, and the bus bar of the second connection line and the bus bar of the third connection line are disposed between the two bus bars.

10. The power conversion device according to claim 2, wherein
the first connection line is composed of the two bus bars connected in parallel to each other, the bus bar of one of the second and third connection lines is disposed between the two bus bars, and the bus bar of the other of the second and third connection lines is disposed outside of the two bus bars.

11. The power conversion device according to claim 2, wherein
the first connection line is composed of the two bus bars connected in parallel to each other, and
the capacitor series circuit is connected to a first side in a longitudinal direction of the stacked bus bar, the power conversion section is connected to a second side in the longitudinal direction of the stacked bus bar, and connection points A for connecting the positive electrode of the capacitor series circuit and the bus bars of the first connection line, a connection point B for connecting the first smoothing capacitor and the bus bar of the third connection line, and a connection point C for connecting the second smoothing capacitor and the bus bar of the third connection line are arranged in an order of the connection points A, the connection point B, and the connection point C from the first side end of the stacked bus bar toward the second side thereof.

12. The power conversion device according to claim 2, wherein
the second connection line is composed of the two bus bars connected in parallel to each other, and the bus bar of the first connection line and the bus bar of the third connection line are disposed between the two bus bars.

13. The power conversion device according to claim 2, wherein
the second connection line is composed of the two bus bars connected in parallel to each other, the bus bar of one of the first and third connection lines is disposed between the two bus bars, and the bus bar of the other of the first and third connection lines is disposed outside of the two bus bars.

14. The power conversion device according to claim 2, wherein
the second connection line is composed of the two bus bars connected in parallel to each other, and
the capacitor series circuit is connected to a first side in a longitudinal direction of the stacked bus bar, the power conversion section is connected to a second side in the longitudinal direction of the stacked bus bar, and connection points D for connecting the negative electrode of the capacitor series circuit and the bus bars of the second connection line, a connection point B for connecting the first smoothing capacitor and the bus bar of the third connection line, and a connection point C for connecting the second smoothing capacitor and the bus bar of the third connection line are arranged in an order of the connection points D, the connection point C, and the connection point B, from the first side end of the stacked bus bar toward the second side thereof.

* * * * *